United States Patent [19]

Umatate

[11] Patent Number: 4,833,621
[45] Date of Patent: May 23, 1989

[54] METHOD OF AND APPARATUS FOR ALIGNING A SUBSTRATE

[75] Inventor: Toshikazu Umatate, Kawasaki, Japan

[73] Assignee: Nikon Corporation, Tokyo, Japan

[21] Appl. No.: 56,955

[22] Filed: Jun. 3, 1987

[30] Foreign Application Priority Data

Jun. 11, 1986 [JP] Japan .................... 61-135565

[51] Int. Cl.⁴ .................... G06F 15/46; G05B 1/06
[52] U.S. Cl. .................... 364/491; 364/468; 437/8; 356/345; 356/401
[58] Field of Search ............ 364/468, 182, 582, 491; 355/53, 86; 356/252, 345, 356, 401, 400; 437/7, 8

[56] References Cited

U.S. PATENT DOCUMENTS

| | | | |
|---|---|---|---|
| 4,052,603 | 10/1977 | Karlson | 364/182 |
| 4,604,562 | 8/1986 | Phillips et al. | 364/582 |
| 4,627,010 | 12/1986 | Kosugi | 364/491 |
| 4,672,557 | 6/1987 | Tamura et al. | 250/548 |
| 4,677,301 | 6/1987 | Tanimoto et al. | 250/234 |
| 4,687,980 | 8/1987 | Phillips et al. | 250/548 |
| 4,699,515 | 10/1987 | Tanimoto et al. | 356/401 |
| 4,702,606 | 10/1987 | Matsuura et al. | 356/401 |

*Primary Examiner*—Jerry Smith
*Assistant Examiner*—Paul Gordon
*Attorney, Agent, or Firm*—Shapiro and Shapiro

[57] ABSTRACT in the production of semiconductor devices, for example, high-accuracy, high-speed alignment of different exposure areas of a wafer with respect to a reticle is achieved by the use, for each exposure area, of a predetermined number of sampling areas that are selected so as to be adjacent to a selected exposure area. A position detector produces position information signals regarding the positions of a plurality of sampling areas and stores the position information signals in a memory. Design data indicating positions of a plurality of sampling areas are also stored in memory. A calculator calculates a correction value for the selected exposure area on the basis of the position information signals and the design data for the selected sampling areas. The wafer is then displaced relative to the reticle in accordance with the correction value and design data for the selected exposure area.

5 Claims, 4 Drawing Sheets

4,833,621

METHOD OF AND APPARATUS FOR ALIGNING A SUBSTRATE

BACKGROUND OF THE INVENTION

1. Field of the Invention

This invention relates to a method of aligning substrates to be worked (wafers or the like) used in the manufacture of semiconductors, and in particular to a method of and an apparatus for successively aligning a plurality of areas to be worked formed on a substrate to be worked relative to a predetermined reference position.

2. Related Background Art

In numerous processes, a wafer for the manufacture of a semiconductive element is subjected to an alignment operation of high accuracy as required. Particularly, the alignment of a reticle pattern (a mask pattern) and a pattern on the wafer in the photolithography process is one of important operations which govern the performance of the semiconductive element. Also, where a defect is present in a part of a circuit made on a wafer, alignment of the wafer to a laser light applying position is an important operation in a repair process wherein a fuse provided in advance in the circuit of the wafer is cut by laser light or the connection of wiring is effected in order to re-connect that part to a spare circuit portion.

In the recent photolithography process, the step-and-repeat type exposure using a reduction projection type exposure apparatus is the current trend. The alignment of a wafer in this system is divided broadly into the global alignment system and the each-die alignment system.

The global alignment system is such that the position of a mark preformed on a wafer is detected with the projection point of the pattern of a reticle as the reference, whereafter on the basis of the result of the detection, wafers are successively caused to effect stepping in an arrangement predetermined in design, thereby accomplishing exposure. On the other hand, the each-die alignment system is such that a mark formed in each exposure shot area on a wafer and a mark formed concomitantly with a pattern on a reticle re aligned relative to each other, after which exposure is accomplished, and this alignment is effected at each exposure shot.

Of the above-described two systems, the global alignment system is high in throughput and suitable for mass production because all alignment operations are completed before the exposure of a wafer. Further, position detection is effected with respect to a plurality of marks scattered on the wafer and the correction of all exposure shot positions from the design value is effected on the basis of the mean value of the result of the detection and therefore, there is an advantage that even when the error of the position detection of the alignment marks has great irregularity, the error can be averaged. The each-die alignment system is low in throughput because alignment (mark position detection) is effected at each shot, and suffers from a disadvantage that the error of the mark position detection at each shot directly governs the superposition accuracy at that shot.

At present, the global alignment system is chiefly used in the manufacture of semiconductors, but as the size of wafers becomes larger, the localized shot (chip) arrangement error attributable to the expansion and contraction of wafers is becoming significant. For this reason, development of an alignment method for obtaining high superposition accuracy while minimizing the reduction in throughput is requisite.

However, in the global alignment system according to the prior art, the shot arrangement on a wafer is prescribed on the basis of the result of the alignment at several points on the wafer and therefore, the presence of any localized arrangement error on the wafer has led to a problem that the superposition accuracy in that portion is reduced. This is a problem which may equally arise in the block alignment system which is a modification of the global alignment system. The block alignment system is a method whereby the surface of a wafer is divided into several large block areas and alignment of several points is effected in each block and the shot arrangement in the block is prescribed on the basis of the result of the alignment. Accordingly, the presence of any localized arrangement error has led to the possibility that the superposition error becomes greater with regard to the shot located near the boundary between adjacent blocks.

The above-described problems regarding the alignment of a wafer may also arise in a repair apparatus. Particularly, in the case of a repair apparatus, the alignment is not between the surface of a reticle and the surface of a wafer as in an exposure apparatus, but between a point and a point (a laser spot and a fuse cutting point) and therefore, considerably high accuracy is required of both the global alignment system and the block alignment system. Further, wafers treated in the repair apparatus have been subjected to frequent heat treatments and therefore, the expansion and contraction (distortion) of the wafers themselves is considerable.

SUMMARY OF THE INVENTION

It is an object of the present invention to provide a method and an apparatus which can accomplish alignment of a substrate to be worked with high accuracy and at high speed in the process concerned with the manufacture of semiconductive devices.

The present invention is a method in which when desired working (exposure or repair) is to be applied to a plurality of areas to be worked (exposure areas or chip areas) on a substrate to be worked (such as a semiconductor wafer), the areas to be worked and tee working reference position (the position of the projected image of a pattern or the laser spot application point) are aligned relative to each other. In effecting such alignment, the present invention includes the following three steps:

(1) The first step of preliminarily effecting the detection of the alignment position with respect to several areas to be worked located around one objective area to be worked on a substrate and present in an area smaller than the total area to be worked on the substrate;

(2) The second step of determining the relative positional relation between said one objective area to be worked and the working reference position by averaging (simple averaging or averaging by a higher-degree statistical technique) the alignment position found at the first step; and (3) The third step of positioning the substrate to be worked on the basis of the positional relation determined at the second step.

In the foregoing three steps, the first to second steps need not always be sequential, but the first step may be caused to cut in during the positioning operation of the third step for working the substrate to be worked. In any of these methods, when one area is to be worked, reference is made to a plurality of alignment positions detected earlier.

By executing the steps as described above, in a step-and-repeat type exposure apparatus, in conformity with a variation in the shot position to be exposed on a wafer, the disposition of shot area preliminarily subjected to alignment (hereinafter referred to as sample alignment) to determine that shot position also varies. Therefore, even if there is a localized arrangement error, the shot position is determined in conformity with that localized error.

DESCRIPTION OF THE PREFERRED EMBODIMENTS

Figure 1:
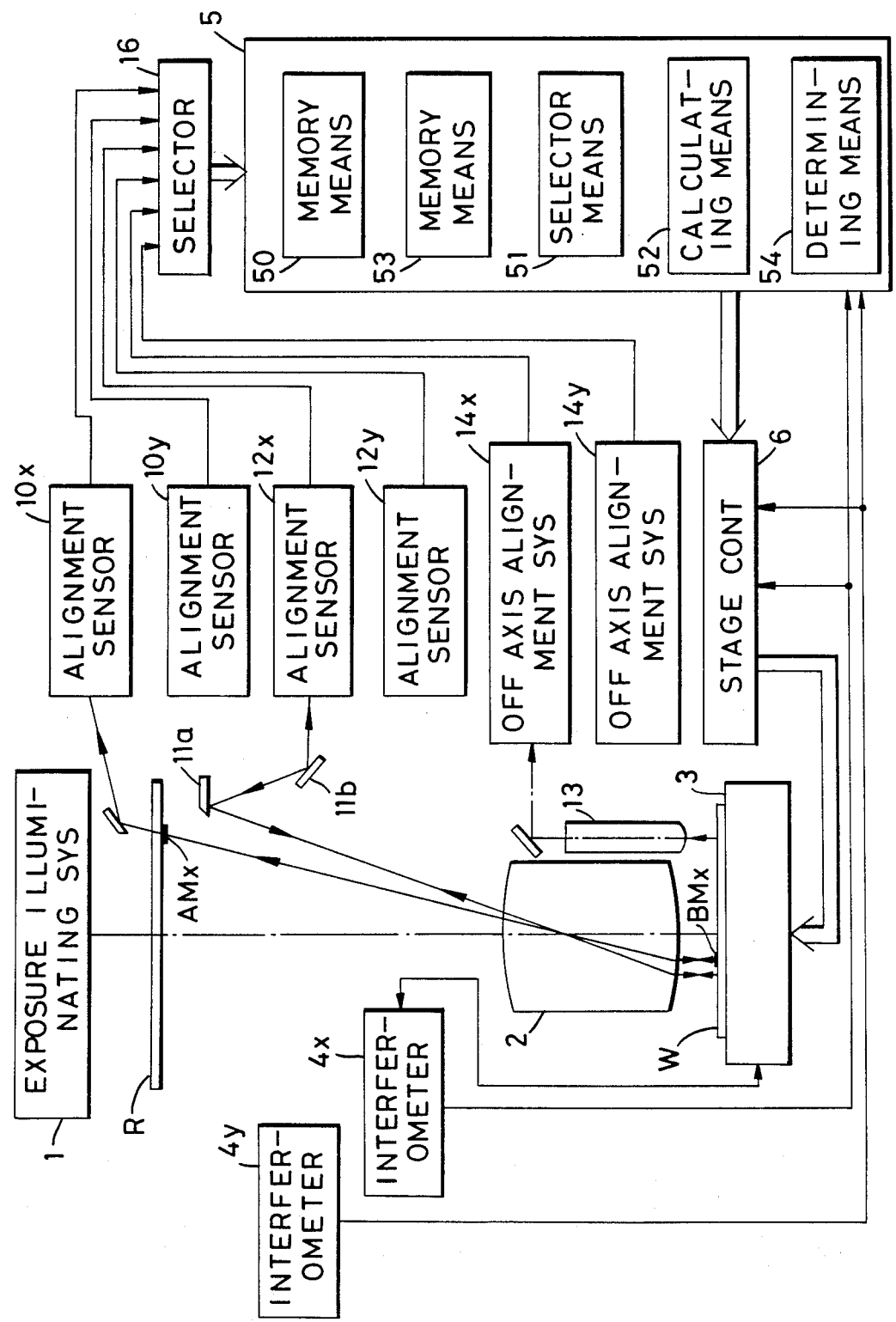
FIG. 1 is a block diagram schematically showing the construction of a reduction projection type exposure apparatus suitable for carrying out the method of the present invention.

FIG. 1 schematically shows the construction of a reduction projection type exposure apparatus suitable for carrying out the method of the present invention. A reticle R which provides a negative is illuminated by exposure light from an exposure illuminating system 1, and a pattern formed on the reticle R or the image of a mark AM for alignment is formed on a predetermined imaging surface by a projection lens 2. A wafer W is placed on a two-dimensionally movable stage 3 so that wafer W coincides with the imaging surface. The position of the stage 3 is normally detected by x direction and y direction laser light wave interference type measuring machines (hereinafter referred to as the interferometers) 4x and 4y. A stage control system 6 includes a motor, and receives as inputs the target position information (shot address value) output from a computer 5 and the current position information output from the interferometers 4x and 4y and effects servo control of the stage 3.

Now, in the present embodiment, three alignment systems of different types are provided. One of them is TTL type alignment sensors 10x and 10y for observing a mark AMx on the reticle R and a mark BMx formed on the wafer W at the same time and detecting the amount of relative deviation of the marks AMx and BMx. The marks AMx and BMx are marks relative to the x direction. A mark AMy on the reticle and a mark BMy on the wafer which correspond to the y direction are omitted. Another alignment system is TTL type alignment sensors 12x and 12y for causing laser light of a wavelength which does not sensitize the photoresist of the wafer W to be reflected by mirrors 11a and 11b and enter the projection lens 2 without the intermediary of the reticle R, forming a light spot at a predetermined position in the projection field (imaging surface), and detecting the optical information from the marks BMx and BMy produced when the wafer W is scanned relative to said light spot, thereby effecting the detection of the position of the wafer W. Still another alignment system is an off-axis type alignment sensor 14x and 14y. In the x direction sensor 14x detects the state of alignment between an index mark provided in the interior of a microscope 13 and the mark BMx when the wafer W is positioned so that the mark BMx is detected by the microscope 13 fixed outside the optical path of the projection lens 2. Sensor 14y operates in the same manner in the y direction. The microscope for the y direction alignment sensor 14y in this system is not shown.

Now, one of the detection signals from the sensors 10, 12 and 14 is selected through a sensor selector unit 16, and the detection signal from the selected sensor and the position information from the interferometers 4x and 4y are stored in memory means 50 at a sample alignment position in the computer 5. Selector means 51 selects predetermined sample alignment position information from the memory means 50 and supplies it to calculating means 52 for calculating a correction parameter used in an operation necessary to specify the shot arrangement on the wafer W. Also, the selector means 51 functions to associate an exposure shot design position output from memory means 53 (storing therein the design position information of the shot arrangement) and a plurality of bits of sample alignment position information out of the memory means 50 in accordance with a predetermined selection standard. Shot exposure position determining means 54 determines the actual position for the stage 3 to step (address) on the basis of the calculated correction parameter and the design position information. The shot exposure position information thus determined is supplied as a shot address value to the stage control system 6.

Figure 2:
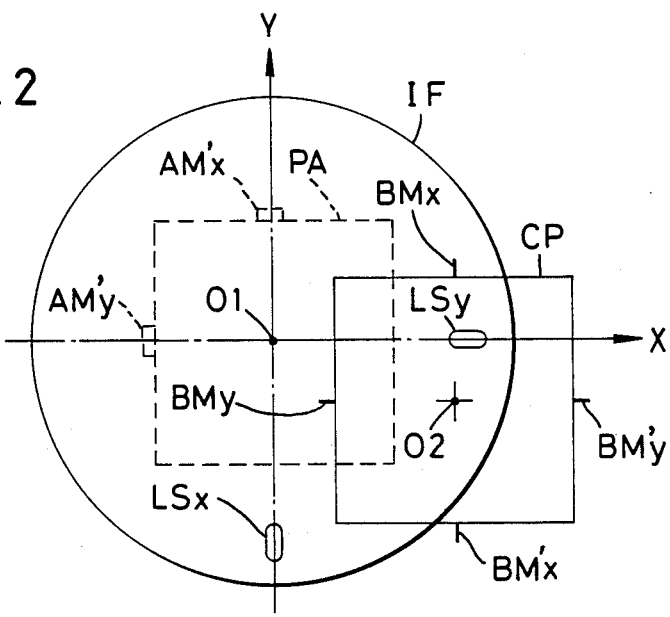
FIG. 2 is a plan view showing the arrangement of the detection center of an alignment sensor in the projection field, alignment marks and shots (chips) on a wafer.

Now, FIG. 2 is a plan view showing the detection center position in the projection field of the two TTL type alignment sensors 10 and 12 shown in FIG. 1. The rectangular coordinates system XY represent the feed coordinates system of the stage 3 prescribed by the interferometers 4x and 4y, and the origin $O_1$ thereof is coincident with the center of a circular image field IF, and the optic axis of the projection lens 2 passes through the origin $O_1$. When the center of the reticle R is coincident with the optic axis, the image of the pattern area to be exposed on the wafer W is PA, and outside the area PA, the images AMx' and AMy' of the marks AMx and AMy on the reticle R are formed on the X-axis and the Y-axis, respectively. The mark image AMx' is for alignment in the X direction, and the mark image AMy' is for alignment in the Y direction. Although a plurality of exposure shot areas CP similar in shape to the image PA are formed in the form of a matrix, only one of these areas is typically shown herein. In the area CP, a mark BMx observable in superposed relationship with the mark image AMx' and a mark BMy observable in superposed relationship with the mark image AMy' when the wafer is positioned so that the center $O_2$ of the area CP is coincident with the center $O_1$ are preformed.

Light spots (sheet beams) LSx and LSy are formed on the X-axis and Y-axis, respectively, of the image field IF by the TTL type alignment sensor 12. Also, a mark BMx' to be detected by the light spot LSx and a mark BMy' to be detected by the light spot LSy are preformed on the area CP. The marks BMx, BMy, BMx' and BMy' accompanying the area CP are provided in each shot area on the wafer W.

Figure 3:
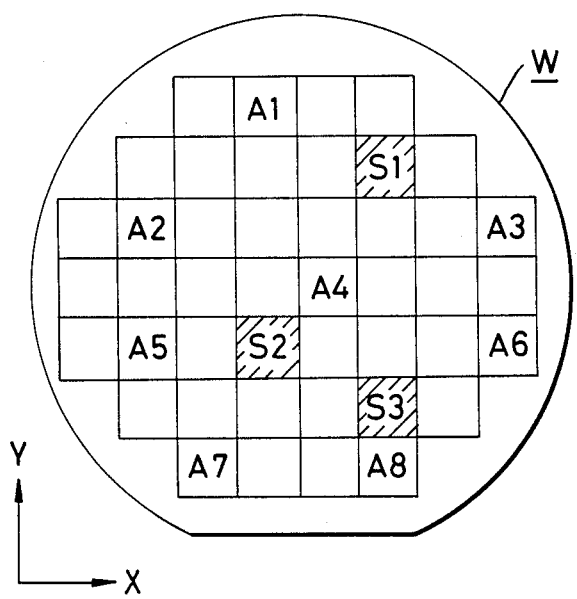
FIG. 3 is a plan view showing an example of the arrangement of sample shots on the wafer.
Figure 4:
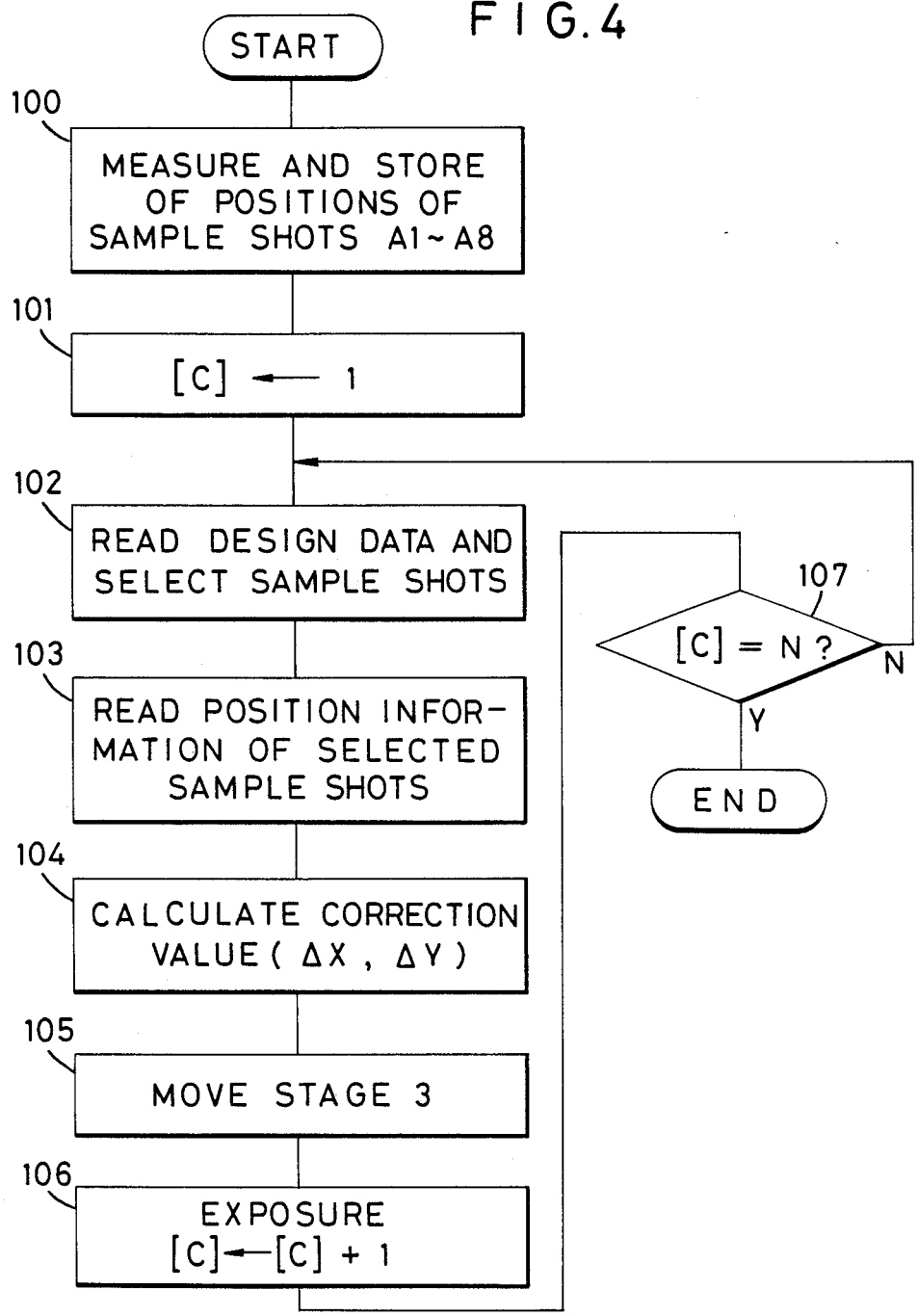
FIG. 4 is a flow chart showing the alignment sequence according to a first embodiment of the present invention.

Reference is now had to FIGS. 3 and 4 to describe a first embodiment of the present invention. FIG. 4 is a schematic flow chart of the exposure sequence controlled by the computer 5, and FIG. 3 is a plan view showing an example of the shot arrangement on the wafer W. It is to be understood that the computer 5 presets eight shot areas $A_1$, $A_2$, $A_3$, $A_4$, $A_5$, $A_6$, $A_7$ and $A_8$ (equal to the area CP in FIG. 2) shown in FIG. 3 is particular sample shots. The number of the shot areas is not limited to eight, and they may be disposed in any manner if they are dispersed as much as possible on the wafer. Also, where the wafer is an 8-inch large wafer and the shot area in which superposition is effected by an exposure is relatively small, the total number of shots on the wafer is several tens to a hundred and therefore, it is necessary to increase the number of shots correspondingly thereto.

The various steps of FIG. 4 will hereinafter be described in succession.

At step 100, measurement of the alignment positions of the eight sample shots $A_1$–$A_8$ shown in FIG. 2 is effected. Any of the alignment sensor 10 and the alignment sensor 12 may be used in this measurement, and the measuring operation using the alignment sensor 12 will first be described. First, the stage 3 is moved so that the marks BMx' and BMy' accompanying the sample shot $A_1$ and the light spots LSx and LSy are scanned relatively, and the detection signal of the alignment sensor 12 and the position information from the interferometers 4x and 4y are stored in the memory means 50 through the sensor selector unit 16. The alignment positions of the sample shots $A_2$, $A_3$, ..., $A_8$ (the positions in the coordinates system XY of the marks BMx' and BMy') are then successively stored in the memory means 50.

At step 101, the content of the counter C in the computer 5 is set to 1.

The above-described operation is the preliminary alignment operation (first steps) of the present invention.

At step 102, the design data of the shot position to be exposed which corresponds to the content of a counter C is read from the memory means 53, and the information thereof is supplied to the selector means 51. In the present embodiment, the selector means 51 selects from among the sample shots $A_1$–$A_8$ the most significant n sample shots located around the exposure shot position and close in distance thereto. At seep 103, the alignment position information of the sample shots selected at step 102 is chosen from the memory means 50 and supplied to the calculating means 52.

For example, if n is set to n=3, when exposure (positioning) is to be effected on the exposure shot $S_1$ shown in FIG. 3, the alignment data of the sample shots $A_1$, $A_3$ and $A_4$ are chosen, and for the exposure (positioning) of the shot $S_2$, the alignment data of the sample shots $A_4$, $A_5$ and $A_7$ are chosen, and for the exposure of the shot $S_3$, the alignment data of the sample shots $A_4$, $A_6$ and $A_8$ are chosen.

At step 104, the calculating means 52 calculates the correction parameter (correction value) on the basis of the design alignment position information (stored in the memory means 53) of n sample shots and the measured alignment position information of the sample shots. When the design alignment position is $(Xp_1, Yp_1)$, $(Xp_2, Yp_2)$, ... $(Xp_n, Yp_n)$ and the measured alignment position is $(Xm_1, Ym_1)$, $(Xm_2, Ym_2)$, ..., $(Xm_n, Ym_n)$, calculation of the correction value ($\Delta X$, $\Delta Y$), is, for example, executed by equations (1) and (2) for effecting simple means processing.

$$\Delta X = \left\{ \sum_{i=1}^{n} (Xm_i - Xp_i) \right\}/n \quad (1)$$

$$\Delta Y = \left\{ \sum_{i=1}^{n} (Ym_i - Xp_i) \right\}/n \quad (2)$$

These correction values $\Delta X$ and $\Delta Y$ are supplied to the determining means 54 for correcting the design position of the shot to be exposed, whereby the stepping position of the stage 3 relative to the exposure shot is determined (the second step of the present invention). At step 105, the determining means 54 causes the stage 3 to effect stepping by the correction values and the design data of the exposure shot and thereby causes the projected image PA of the pattern of the reticle R to overlap the shot area CP.

The stepping of the stage 3 is terminated, and at step 106, the light from the exposure illuminating system is applied to the reticle R for a predetermined time. Thereby the pattern of the reticle R is exposed on the photoresist layer of the wafer W. The content of the counter C is then incremented by 1.

Subsequently, at step 107, whether the exposure of all the shots on the wafer W has been terminated is judged, and if it has been terminated, processing of a wafer is completed, and if it has not been terminated, the operations from step 102 are again repeated so that exposure is effected on the next exposure shot. The total number, of exposure shots is N.

If steps 102–104 are executed during the period in which the previous exposure shot is exposed. for example, during 0.2 to 1 second, the throughput will hardly be reduced as compared with the prior art global alignment type exposure. Also, the calculation of the correction value at step 104 or the calculation for determining the optimum position of the exposure shot can be likewise accomplished by the technique disclosed in the applicant's U.S. application Ser. No. 760,037 filed July 29, 1985. This technique is to correct the design shot arrangement by the use of the minimum squaring method so that in the representation relation between the design shot arrangement and the actual shot arrangement on the wafer found by sample alignment, the superposition error thereof is averagely small with respect to any shot, and find the actual shot position (the stepping position). The parameters which prescribe the representation relation are the amount of rotation error of the shot arrangement on the wafer in the coordinates system XY, the degree of orthogonality of the shot arrangement on the wafer, the amount of shift of the design shot arrangement and the actual shot arrangement in the XY direction, and the amount of linear expansion and contraction of the wafer. Where this method is applied, it is preferable, for accuracy, to set as many sample shots as possible and effect sample alignment.

Figure 5:
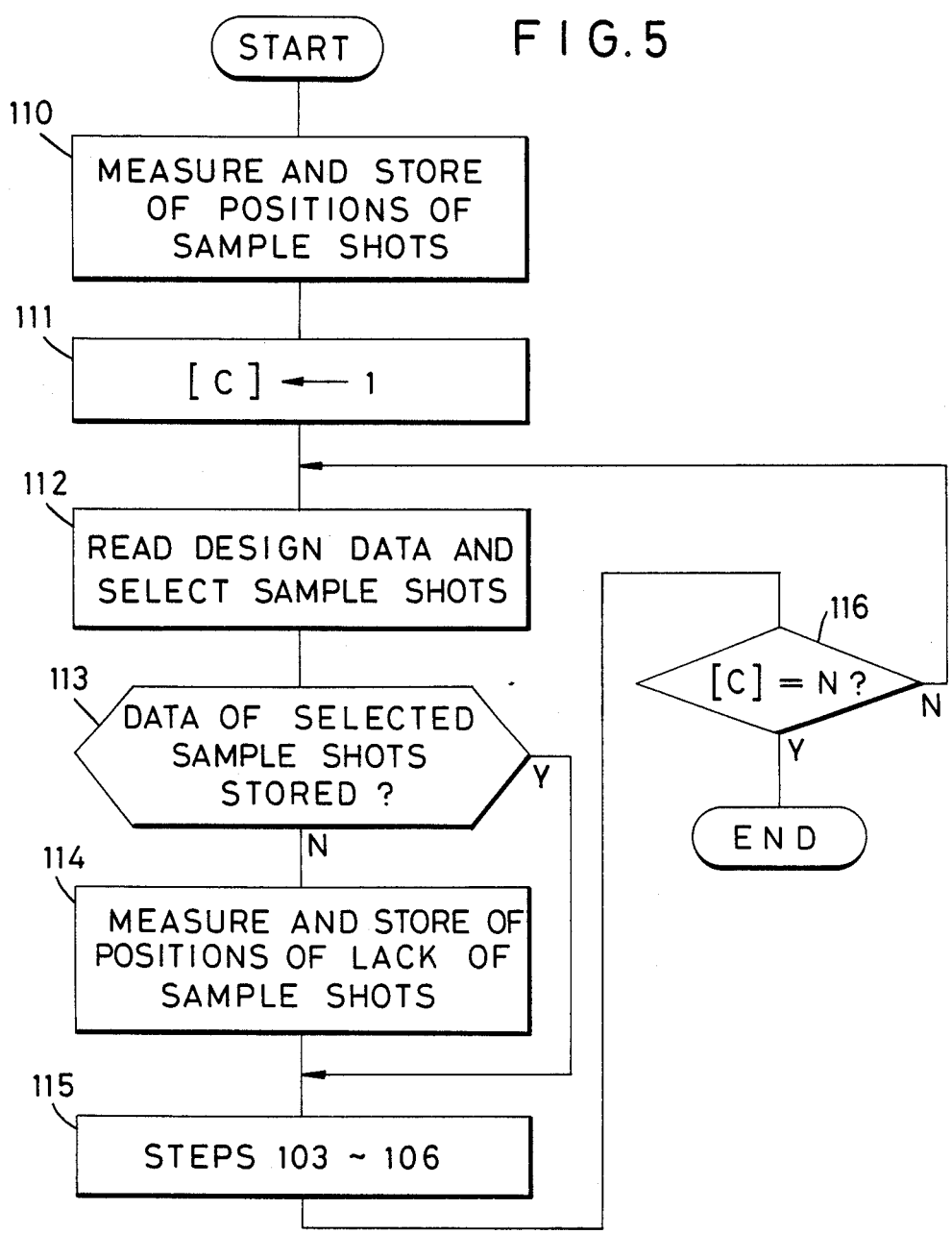
FIG. 5 is a flow chart showing the alignment sequence according to a second embodiment of the present invention.

A second embodiment of the present invention will now be described by reference to the flow chart of FIG. 5.

At step 110, the alignment position of the necessary number and position of sample shots for the first shot exposure to the wafer W is measured. For example, assuming that in FIG. 3, exposure is begun from the lowermost left shot area on the wafer W, it suffices to effect sample alignment of at least three shots $A_7$, $A_8$ and $A_5$ at this step and store the position information. Alignment of the other sample shots is not effected here. At step 111, the content of the internal counter C is set to 1.

Step 112 is entirely the same as the step 102 shown in FIG. 4. However, at least in the case of the first shot exposure, there are only three bits of alignment position information to be selected and therefore, data search will not take much time.

At step 113, whether among the sample shots selected at step 112, there is one about which the alignment position information measurement was effected at step 110 around the shot area to be exposed is judged. That is, whether the data of the sample shot selected at step 112 is stored in memory means 50 is judged. When additional sample alignment is necessary, advance is made to step 114, and when no additional sample alignment is necessary, advance is made to step 115.

At step 114, alignment of lack of sample shots is effected. For example, where exposure progresses from the lowermost left shot area in FIG. 3 and exposure is to be effected on the shot area $S_3$, it being understood that the alignment data of the sample shots $A_8$, $A_4$ and $A_6$ are used in the positioning of the shot area $S_3$, the lack is the sample shots $A_4$ and $A_6$ Accordingly, sample alignment of the sample shots $A_4$ and $A_6$ is effected and the alignment data is stored in the memory means 50.

The next step 155 is just the same as the steps 103–106 of FIG. 3, and if at step 116, it is judged that exposure of all the shots has not been terminated, the program returns to step 112 and similar operations take place repeatedly.

In the present embodiment, a sample alignment operation cuts in as required during the exposure of a wafer, but in terms of the throughput, the present embodiment is substantially similar to the first embodiment.

Also, in the present embodiment, preliminary alignment is effected with respect only to the minimum sample shots necessary for the exposure of the first shot, but alternatively, this embodiment may be combined with the first embodiment. That is, with respect to the eight sample shots $A_1$–$A_8$ in FIG. 3, alignment may be effected before the exposure operation is started, and with respect to the other predetermined sample shots, the alignment operation may be caused to cut in as required after the exposure operation is started.

While first and second embodiments of the present invention during alignment sensor 12 have been described above, the means for sample alignment can be likewise utilized by the alignment sensor 10 of FIG. 1. Further, where the distance (base line) between the position of the pattern projected image PA of the reticle R on the coordinates system XY and the position of the detection center (visual target mark) of the off-axis type alignment system 14 is accurately controlled, the alignment system 14 may be used to effect sample alignment. Also, in both of the first and second embodiments, it is to be understood that the disposition and number of the sample shots on the wafer W are suitably predetermined and sample shots to be referenced are pre-allotted to the respective ones of all the exposure shots, and this is for minimizing the time for searching the sample shots to be referenced during the exposure operation. Further, while the number of the sample shots to be referenced has been described as three for one exposure shot, this number is not fixed, and may fluctuate for each exposure shot position in conformity with the selection standard of the sample shots. Also, in the exposure of a certain sample shot itself, the average of the alignment data of that sample shot and the alignment data of at least one other sample shot may be referred to.

Where in the selection of the sample shots, there is a sample shot to be referenced in the adjacent maximum eight shot areas around the objective exposure shot, great weighting may be effected with respect to the alignment data of this sample shot, and where there is a sample shot to be referenced in the adjacent maximum sixteen shot areas around the objective exposure shot, small weighting may be effected with respect to the alignment data of that sample shot. That is, there is an advantage that the amount of correction is found from the weighting average corresponding to the distance from the exposure shot to the sample shot to be referenced, whereby a localized arrangement error created in the portion remote from the exposure shot can hardly appear in the error of the position determination of that exposure shot.

The present invention is applicable not only to the step-and-repeat type exposure apparatus (the projection type exposure apparatus, the X-ray exposure apparatus or the like), but also to the alignment method for a repair apparatus, a wafer prober or the like.

I claim:

1. An apparatus provided with working means for applying desired working to one of a plurality of predetermined areas on a substrate, including:

supporting means for supporting said substrate thereon;

displacing means for imparting relative displacement between said supporting means and said working means;

memory means in which design data are stored, the design data indicating positions of a plurality of predetermined sampling areas corresponding to a part of said plurality of predetermined areas;

position detecting means for producing position information signals regarding the positions of said plurality of predetermined sampling areas on said substrate supported by said supporting means, and storing said position information signals in said memory means;

selecting means for detecting, from among said plurality of predetermined sampling areas, a predetermined number of sampling areas, that are adjacent to said one of said plurality of predetermined areas;

calculating means for reading out from said memory means said position information signals and said design data conforming to said predetermined number of sampling areas selected by said selecting means, and for calculating a correction value conforming to said one of said plurality of predetermined areas on the basis of the read-out position information signals and design data; and determining means for causing said displacing means to impart relative displacement between said supporting means and said working means on the basis of said correction value and design data conforming to said one of said plurality of predetermined areas, and thereafter causing said working means to apply said desired working to said one of said plurality of predetermined areas.

2. An apparatus according to claim 1 wherein said calculating means calculates differences between the positions indicated by design data of the selected sampling areas and the positions indicated by said position information signals of said selected sampling areas, and calculates a mean value of said differences.

3. An apparatus according to claim 2, wherein said determining means causes said displacing means to impart relative displacement between said supporting means and said working means on the basis of said mean value and said design data conforming to said one of said plurality of predetermined areas.

4. An apparatus according to claim 3, wherein after said desired working is applied to said one of said plurality of predetermined areas, said selecting mans selects, from among said plurality of predetermined sampling areas, a predetermined number of sampling areas that are nearer than other sampling areas to another of said plurality of predetermined areas, and wherein said working means applies said desired working to said another of said plurality of predetermined areas.

5. An apparatus provided with working means for applying desired working to a plurality of predetermined areas on a substrate, including:
  supporting means for supporting said substrate thereon;
  memory means in which design data are stored, said design data indicating positions of a plurality of predetermined sampling areas corresponding to a part of said plurality of predetermined areas;
  displacing means for imparting relative displacement between said supporting means and said working means;
  position detecting means for detecting positions of said plurality of predetermined sampling areas on said substrate supported by said supporting means, for producing position information signals regarding the detected positions, and for storing said position information signals in said memory means;
  selecting means for sequentially selecting different ones from among said plurality of predetermined areas, and for correspondingly selecting from among said plurality of predetermined sampling areas, a predetermined number of sampling areas that are adjacent to the selected one of said plurality of predetermined areas;
  calculating means for reading out from said memory means said position information signals and said design data conforming to the predetermined number of sampling areas selected by said selecting means, and for calculating a correction value conforming to the selected one of said plurality of predetermined areas on the basis of the read-out position information signals and design data;
  determining means for causing said displacing means to impart relative displacement between said supporting means and said working means on the basis of said correction value and said design data conforming to the selected one of said plurality of predetermined areas, and thereafter causing said working means to apply said desired working to the selected one of said plurality of predetermined areas; and
  means for detecting that a selected sampling area does not belong to said plurality of predetermined sampling areas and for producing a detection signal which causes said position detecting means to produce position information signals conforming to said sampling area that does not belong.

* * * * *